United States Patent
Shimada et al.

[11] Patent Number: 5,828,098
[45] Date of Patent: Oct. 27, 1998

[54] SEMICONDUCTOR CAPACITOR DIELECTRIC HAVING VARIOUS GRAIN SIZES

[75] Inventors: Yasuhiro Shimada, Osaka; Yasuhiro Uemoto, Otsu; Atsuo Inoue, Koyoto; Taketoshi Matsuura, Takatsuki; Masamichi Azuma, Otsu, all of Japan

[73] Assignee: Matsushita Electronics Corporation, Osaka, Japan

[21] Appl. No.: 667,913

[22] Filed: Jun. 20, 1996

[30] Foreign Application Priority Data

Jun. 22, 1995 [JP] Japan ................................. 7-155921

[51] Int. Cl.$^6$ ................................................. H01L 29/43
[52] U.S. Cl. ............................................ 257/310; 257/532
[58] Field of Search ................................... 257/295, 310, 257/507, 532

[56] References Cited

U.S. PATENT DOCUMENTS 4,466,177  8/1984  Chao ......................................... 257/532

FOREIGN PATENT DOCUMENTS 4-206872   7/1992   Japan .
5-343642   12/1993  Japan .
6-29462    2/1994   Japan .
WO 94 10084 A  5/1994  WIPO .

*Primary Examiner*—David B. Hardy
*Attorney, Agent, or Firm*—McDermott, Will & Emery

[57] ABSTRACT

This invention relates to a semiconductor device with embedded capacitor elements of which capacitor insulation layer is made of ferroelectric layer or dielectric layer of high dielectric constant, and its manufacturing method. This invention is made in order to solve the problems of rapid increase of leak current of capacitor element and the poor reliability caused by the large deviation of crystal sizes of conventional capacitor insulation layer of capacitor element incorporated in the semiconductor device. This is accomplished by the invention of a capacitor element consisting of a substrate of semiconductor integrated circuit, a first electrode selectively deposited on the surface of said substrate, a capacitor insulation layer having a high dielectric constant deposited selectively on the surface of said first electrode, and a second electrode deposited on the surface of said capacitor insulation layer avoiding the contact with the first electrode, of which average grain diameters of crystal grains constituting the capacitor insulation layer are within a range of 5 to 20 nm, and the standard deviation of the sizes of crystal grains constituting said capacitor insulation layer is within 3 nm.

7 Claims, 7 Drawing Sheets

SEMICONDUCTOR CAPACITOR DIELECTRIC HAVING VARIOUS GRAIN SIZES

FIELD OF THE INVENTION

This invention relates to a semiconductor device having embedded capacitor elements of which capacitor insulation layer is made of a ferroelectric layer or dielectric layer having a high dielectric constant, and its manufacturing method.

BACKGROUND OF THE INVENTION

The electromagnetic noises radiated from various electronic devices have been causing serious problems interfering the operation of electronic devices where the information processes are performed at higher speed and lower voltage.

As an effective means reducing the undesirable electromagnetic radiation, a method incorporating a large capacitance element of which capacitor insulation layer is made of ferroelectric layer or dielectric layer having a high dielectric constant into a semiconductor integrated circuit has been employed. In addition to this, efforts to develop a non-volatile memory operating at low voltage enabling both the high speed writing and readout by utilizing the hysteresis characteristics of ferroelectric layer have been made extensively.

A semiconductor device with a conventional built-in capacitor element is now explained by referring FIGS. 6 to 10 wherein the conventional capacitor element shown in FIG. 6 mounted on substrate 1 of semiconductor integrated circuit, consists of the first electrode 2 made of platinum selectively deposited on substrate 1, capacitor insulation layer 3 made of a dielectric layer of high dielectric constant such as a layer of $Ba_{0.7}Sr_{0.3}TiO_3$ deposited on the first electrode 2, and second electrode 4 made of platinum deposited on capacitor insulation layer 3 avoiding its contact with the first electrode 2.

The manufacturing process of the capacitor insulation layer consists of a deposition of first electrode 2 by using a vacuum sputtering or electron-beam deposition method on the surface of substrate 1, and this is followed by a further deposition of the $Ba_{0.7}Sr_{0.3}TiO_3$ layer on the surface by means of a spin coating, sputtering, or CVD (Chemical Vapor Deposition) method.

This is then placed in a furnace kept in an atmosphere of oxygen, and its temperature is increased to 650° C. at a rate of 70° C./min, and is held there for about one hour. By this, the $Ba_{0.7}Sr_{0.3}TiO_3$ layer is sintered and the capacitor insulation layer 3 is formed.

After depositing the second electrode 4 on the surface of capacitor insulation layer 3 by means of a sputtering or electron-beam deposition method, the capacitor element is obtained by removing the unnecessary parts of first electrode 2, capacitance insulation layer 3, and the second electrode 4 by using either a plasma etching method or a wet chemical etching method.

A fine structure of the capacitor insulation layer made of $Ba_{0.7}Sr_{0.3}TiO_3$ deposited by a conventional method and incorporated in a semiconductor device is shown in FIG. 7 by referring its cross-section wherein capacitor insulation layer 3 having a thickness of about 185 nm is constituted of number of crystal grains 5 of different grain size. The sizes of crystal grains 5 are smaller at a region closer to first electrode 2 while those are larger at a region closer to second electrode 4, and this shows that capacitor insulation layer 3 consists of number of crystal grains of different size having an average grain size of about 12 nm as shown in FIG. 8 and having a standard deviation of 3.9 nm.

FIG. 9 shows a current vs. electric field characteristics of the capacitor element with embedded capacitor insulation layer fabricated by a conventional method and is incorporated in a semiconductor device when an electric field is applied thereon, and the values of current divided by electric field are plotted on the vertical axis and the square roots of electric field are plotted on the horizontal axis.

As shown by the diagonal lines in FIG. 7, the regions where the curves determined by the respective temperatures of room-temperature, 100° C., and 150° C. change into linear regions are appeared at the regions where the electric field of more than 0.44 MV/cm is applied at the room temperature, 0.24 MV/cm at a temperature of 100° C., and 0.07 MV/cm at 150° C., and the electric field where the linear region appears is called critical electric field.

FIG. 9 shows that the carrier conduction of capacitor insulation layer of the capacitor element is governed by the Frenkel-Poole type hopping conduction when it is placed in an electric field hatched by oblique lines (For example, see Shimada et al,; The 12th Ferroelectric Material Application Conference, 26-TC-11, Kyoto, 1995).

However, a major reliability problem due to a large deviation of crystal size distribution in the capacitor insulation layer is produced when it is incorporated in a conventional semiconductor device. That is, an accelerated life test applying a DC electric field stress to the subjected capacitor element for a predetermined period under a condition of high-temperature (hereinafter this is called a high temperature bias test), and a relationship between the leak current and the test period obtained after the temperature is turned down to the room temperature within a predetermined period is determined in order to evaluate the reliability of semiconductor device with a conventional built-in capacitor element.

As a condition of the stress, a DC electric field of 0.32 MV/cm (6V in voltage) is applied to the device kept at a temperature of 100° C., and the result of this is shown in FIG. 10 wherein Curve-A shows a result of this, testing the semiconductor device with a conventional embedded capacitor element, and this shows a rapid increase in leak current of capacitor element when a testing period of more than several hundred hours is applied.

Likewise, Curve-B in FIG. 10 shows a result of the same test applied on a standard silicon semiconductor device operated at a voltage of 5 V, or for instance, a result of the accelerated test applying the same electric field and temperature between the gate electrode and the drain electrode of MOS transistor. This shows no significant change of the threshold voltage of MOS transistor even after the application of test condition of more than 1000 hours.

As shown in the above, a problem of significantly inferior reliability of semiconductor device with a conventional built-in capacitor element over that of conventional silicon semiconductor device is recognized.

SUMMARY OF THE INVENTION

The object of the present invention is to offer a method to suppress the leak current of capacitor element incorporated in the semiconductor device at a minimum level for long period and to offer a manufacturing method of semiconductor having a excellent reliability.

The invented semiconductor device incorporating a capacitor element consists of a substrate on which an integrated circuit is disposed, a first electrode selectively disposed on said substrate, a capacitor insulation layer of high dielectric constant disposed on the surface of said first electrode, and a second electrode disposed on the surface of said capacitor insulation layer avoiding the contact with said first electrode, wherein the average size of crystal grains constituting said capacitor insulation layer is within a range of 5–20 nm, and the standard deviation of grain size distribution at said average grain size is within 3 nm.

Furthermore, in the process obtaining said semiconductor device, after the selective deposition of said first electrode on said substrate of integrated circuit and said dielectric layer of a high dielectric constant on said first electrode, said layers are heated to a sintering temperature of said dielectric layer at a rate of 0.1° C.–10° C./min in an oxygen atmosphere crystallizing said dielectric layer forming a capacitor insulation layer, and said second electrode is further deposited on the surface of said capacitor insulation layer avoiding the contact with said first electrode.

Therefore, according to the manufacturing method of present invention, a standard deviation of crystal grain size of said dielectric layer kept less than 3 nm can be obtained, and thus, the leak current can be minimized even under a stress condition of high temperature and high electric field, and any increase in leak current can be suppressed for an extended period.

DESCRIPTION OF THE PREFERRED EMBODIMENTS

Figure 5:
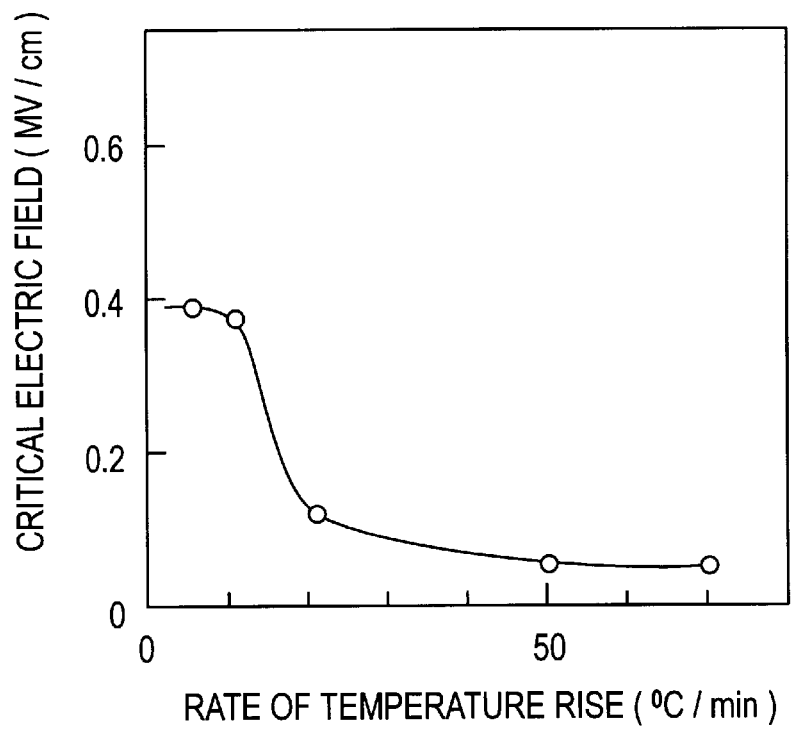
FIG. 5 shows a relationship between the rate of temperature increase employed in the sintering process of said capacitor insulation layer and the critical electric field.
Figure 6:
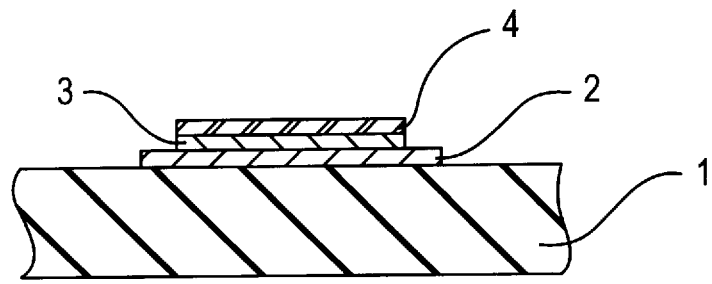
FIG. 6 shows a partial cross-section of semiconductor device of both the invented and the conventional types.
Figure 7:
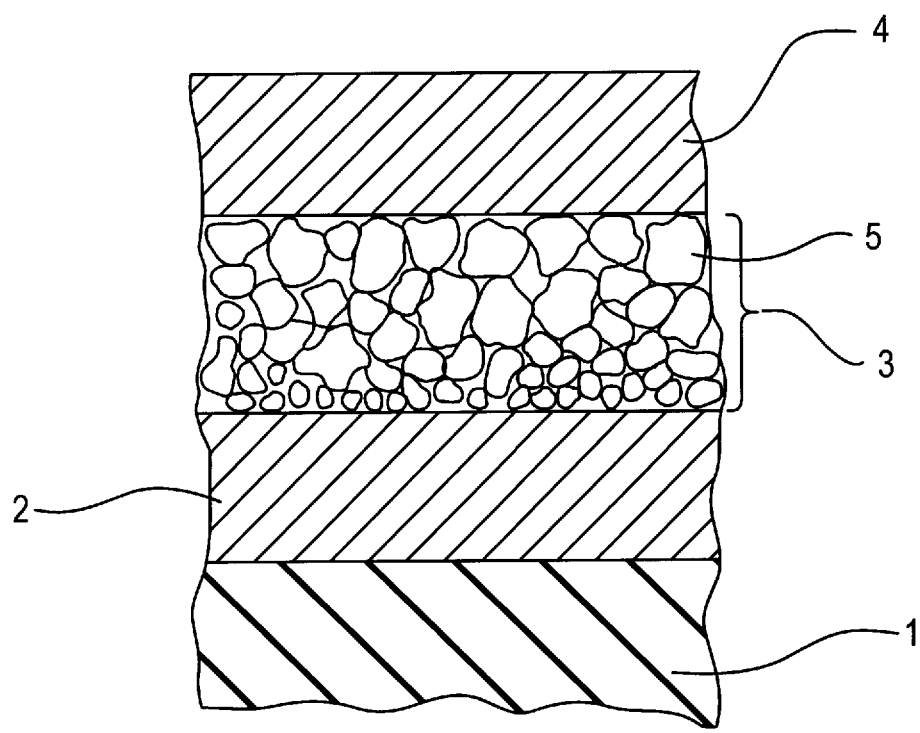
FIG. 7 shows a partial cross-section of conventional capacitor element incorporated in a semiconductor device.
Figure 8:
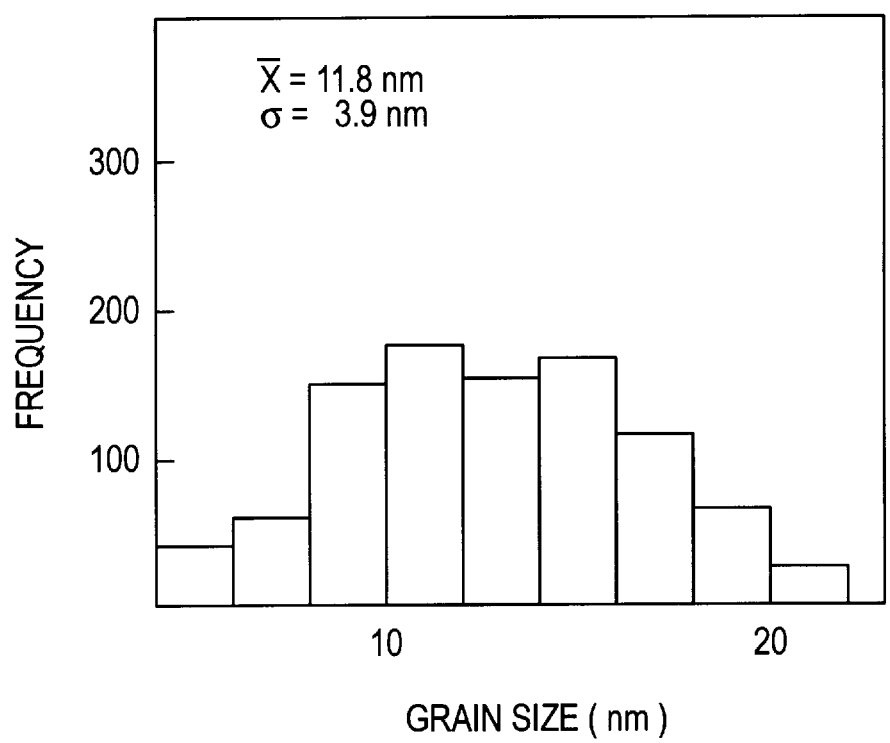
FIG. 8 shows a frequency distribution of crystal sizes constituting said capacitor element incorporated in said semiconductor device.
Figure 9:
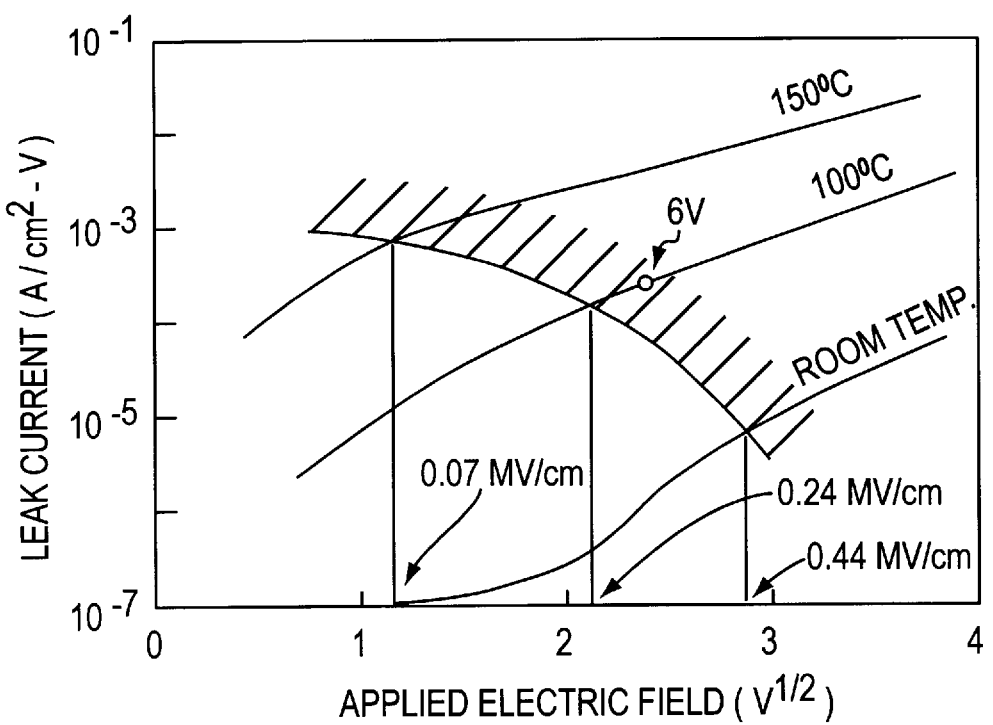
FIG. 9 shows a current-electric field characteristics of said capacitor element incorporated in said semiconductor device.
Figure 10:
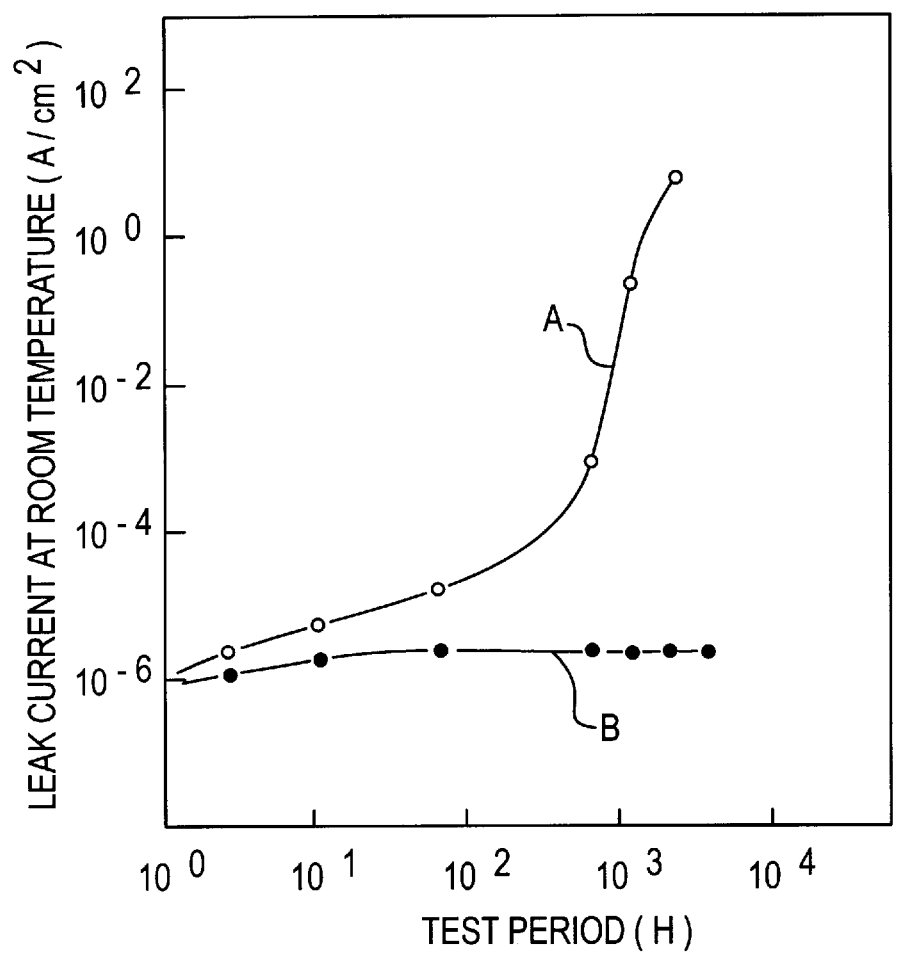
FIG. 10 shows relationships between the leak current and the testing period under a high-temperature and high electric field of the semiconductor device (A) with a conventional built-in capacitor element and the semiconductor device (B) with a general silicon semiconductor device.

One of the embodiments of the invention is now explained in below by referring FIGS. 1 to 5 wherein the components common with the conventional semiconductor devices shown in FIGS. 6 and 7 are referred by the same numbers.

Since the structure of semiconductor device incorporating the invented capacitor elements is fundamentally identical with that of conventional semiconductor device except the crystal structure of capacitor insulation layer, and since the manufacturing method of the device is identical with that of conventional semiconductor device except the sintering process of said capacitor insulation layer, the detailed explanations of these are omitted here, and only the differences from the conventional semiconductor device and from its manufacturing method are explained.

Figure 1:
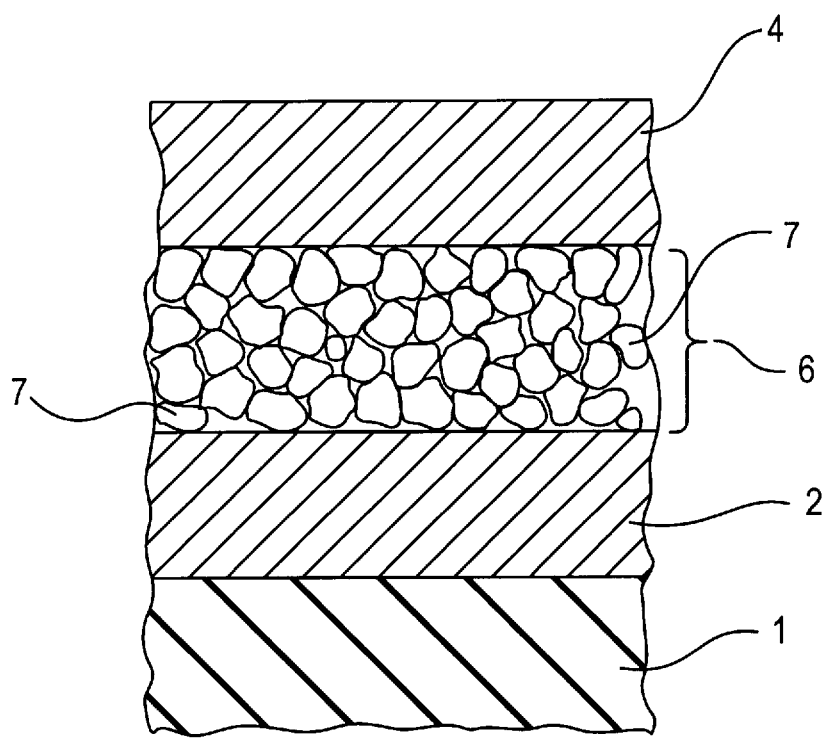
FIG. 1 shows a partial cross-section of the capacitor element which is an example of the invention incorporated in a semiconductor device.

FIG. 1 shows a partial enlargement of the cross-section of semiconductor device which is an example of the inventions, and this shows capacitor insulation layer 6 disposed between the first electrode 2 made of platinum or others, and the second electrode 4 made of platinum or others where the distribution of the sizes of crystal grain 7 is within an order of 3 nm.

The method deriving the capacitor insulation layer is now explained by referring a manufacturing method of the invented semiconductor device.

First of all, the author of the invention assumed that a conduction mechanism of carriers in the capacitor insulation layer should be responsible for the increase of leak current under a high temperature and high electric field and that the fine structure of capacitor insulation layer should be responsible to the conduction mechanism. Therefore, the fine structures of the capacitor insulation layers obtained by setting the sintering temperature at 650° C. and by changing the rate of temperature rise at 5° C./min, 10° C./min, 20° C./min, 50° C./min, and 70°C./min respectively in the process manufacturing said capacitor insulation layer, have been investigated.

As a result of these experiments, it has been found that a capacitor element with a capacitor insulation layer consisting of uniform $Ba_{0.7}Sr_{0.3}TiO_3$ crystal grains 7 having a thickness of about 185 nm can be obtained as shown in FIG. 1 when the sintering is performed by setting the temperature rise at a rate of 5° C./min or 10° C./min, and that an accelerated life-test of the leak current of thus obtained semiconductor device is shown by Curve-B which is nearly equivalent to the stable characteristics of general silicon semiconductor devices.

Figure 2:
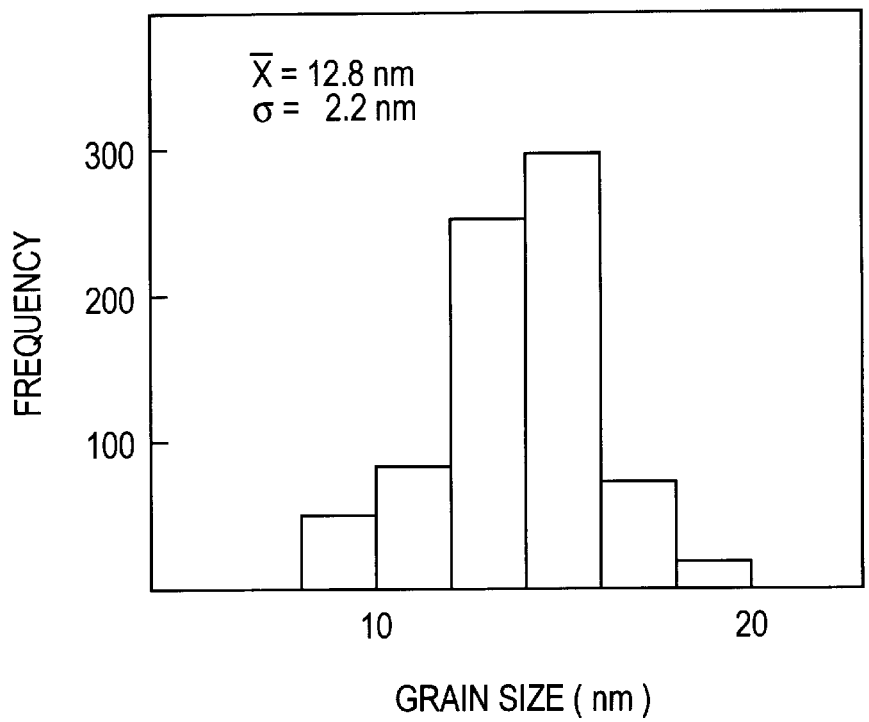
FIG. 2 shows a frequency distribution of crystal grain sizes constituting the capacitor insulation layer of said example incorporated in said semiconductor device.

Furthermore, the distribution of sizes of crystal grain 7 constituting the capacitor insulation layer 6 obtained by these experiments are shown in FIG. 2.

As shown in FIG. 2, although the average size of crystal grains 7 is 12.8 nm which is nearly same as that of the capacitor insulation layer incorporated in the conventional semiconductor device, the standard deviation of sizes of the crystal grains constituting the capacitor insulation layer is 2.2 am which is apparently smaller than the standard deviation of sizes of the conventional crystal grains.

Figure 3:
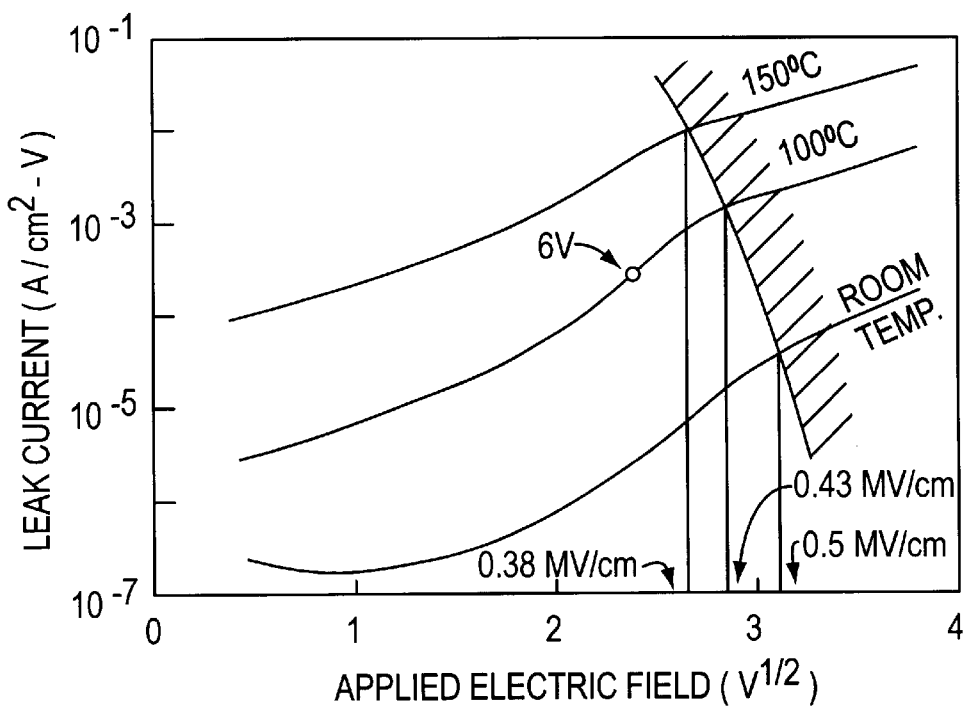
FIG. 3 shows a current-electric field characteristics of said capacitor insulation layer which is an example incorporated in said semiconductor device.

FIG. 3 shows a current vs. electric field characteristics of capacitor element incorporated in a semiconductor device obtained when an electric field is applied, showing a substantial increase of the critical field at 150° C. from 0.38 MV/cm to 0.7 MV/cm obtained by a conventional semiconductor device. Moreover, the critical electric field at 100° C. is 0.43 MV/cm and that is 0.5 MV/cm at room temperature, and these show substantial increases of the critical electric field of capacitor element incorporated in the conventional semi-conductor device.

As shown in FIG. 3, since the above-said high-temperature bias test (6V, at 125° C.) is conducted at a condition substantially less than the critical electric field of this example, it is considered reasonably that the semiconductor device incorporating the invented capacitor element shows a stable leak current characteristics.

As shown in the above, the stability of leak current characteristics depends on the condition of high-temperature bias test whether it exceeds the critical electric field or not, and since the stable field region is extended when the critical electric field is elevated, the factors determining the higher critical field strength are investigated.

The difference of the construction of invented capacitor insulation layer from that of conventional capacitor insulation layer is only a difference between the standard deviations of crystal grains of dielectric while that of conventional capacitor insulation layer is 3.9, that of the invented capacitor insulation layer is 2.2.

Figure 4:
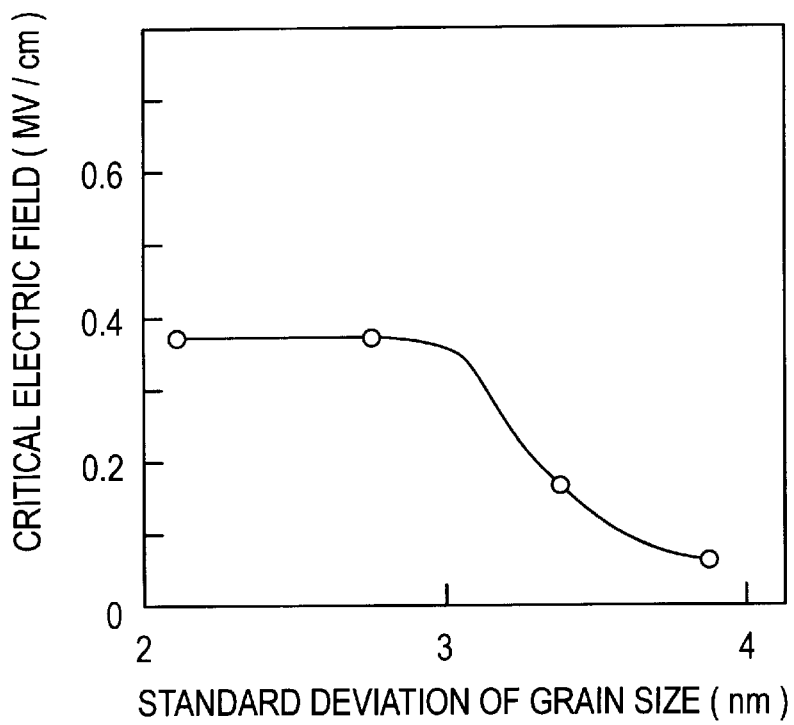
FIG. 4 shows a relationship between the standard deviation of size distribution of crystals constituting the capacitor insulation layer incorporated in said semiconductor device and the magnitude of critical electric field.

The inventor of the invention have investigated the mutual relationship between the standard deviation of crystal grain size and the critical electric field at 150° C. in order to identify the effects of this difference, and the result of this is shown in FIG. 4.

As shown in FIG. 4, very little dependency of the critical electric field intensity on the standard deviation of crystal grain size of capacitor insulation layer is found up to a standard deviation of 3 nm, but the critical electric field is decreased very rapidly in a range exceeding 3 nm.

In another words, it became obvious that the standard deviation of crystal grain sizes have to be kept at a value less than 3 nm in order to realize a stable leak current characteristics at the high-temperature bias test.

Then, the relationship between the temperature ramp rate in the sintering process of capacitor insulation layer 6 and the critical electric field strength at 150° C. is shown in FIG. 5 showing a rapid decrease of critical electric field strength when the temperature ramp rate at the sintering process exceeds a rate of 10° C./min.

That is, it is found that the temperature ramp rate in the process of sintering of capacitor insulation layer have to be set in a range between 0.1° C. to 10° C./min in order to obtain a smaller standard deviation of crystal grain sizes and to obtain a stable leak current characteristics.

Furthermore, the above explanation is made so far for a case where the capacitor insulation layer is made of $Ba_{0.7}Sr_{0.3}TiO_3$ crystal grains, the same effect can be obtained regardless the mol-ratio between the Ba and Sr elements including the mol-ratio of the present case. Moreover, not only the case of $Ba_{0.7}Sr_{0.3}TiO_3$, but various perovskite dielectrics of high dielectric constant can be used as the capacitor insulation layer.

Although the present explanation has been made so far by utilizing an analytical theory related to the stability of capacitor insulation layer defining the critical electric field where the Frenkel-Poole type hopping conduction is dominant, the same result can be obtained from the analysis using the stability of capacitor insulation layer is a time-dependent dielectric breakdown(TDDB), or using a theory defining that the breakdown voltage of insulation layer is a measure for evaluating the stability of capacitor insulation layer.

According to the above-shown example, by forming a capacitor insulation layer by increasing the temperature of dielectrics of high dielectric constant constituting the capacitor insulation layer at a rate of 5° C. or 10° C./min to the sintering temperature, and by crystallizing the dielectric layer, a capacitor insulation layer having a uniform distribution of grain sizes centering at the average size of grains, and having a standard deviation of grain size within 2.2 nm, and having a low leak current even in a condition of high-temperature and high electric field, and having a low leak current possible to keep for a long period increasing the reliability of semiconductor device, can be obtained.

What is claimed is:

1. A semiconductor device with embedded capacitor elements comprising;

a substrate of a semiconductor integrated circuit, a first electrode deposited on a surface of said substrate, a capacitor insulation layer having a high dielectric constant deposited on a surface of said first electrode, and a second electrode deposited on a surface of said capacitor insulation layer, wherein said second electrode is not in contact with the first electrode, wherein crystal grains constituting said capacitor insulation layer comprise various particle sizes, wherein said various particle sizes have an average particle size within a range of 5 to 20 nm, and wherein said various particle sizes comprise a standard deviation within 3.0 nm or less.

2. The semiconductor device according to claim 1, wherein an accelerated leak current of said capacitor element is less than $10^{-5}$ A/cm$^2$ after 1,000 hours.

3. The semiconductor device according to claim 1, wherein said various particle sizes comprise a standard deviation within 2.2 nm.

4. The semiconductor device according to claim 1, wherein said semiconductor device exhibits a critical field of about 0.7 MV/cm at about 150° C.

5. The semiconductor device according to claim 1, wherein said semiconductor device exhibits a critical field of about 0.43 MV/cm at about 100° C.

6. The semiconductor device according to claim 1, wherein said semiconductor device exhibits a critical field of about 0.5 MV/cm at room temperature.

7. The semiconductor device according to claim 1, wherein sizes of crystal grains at a region closer to said first electrode are nearly equivalent to sizes of crystal grains at a region closer to said second electrode.

* * * * *